(12) United States Patent
Kamitani et al.

(10) Patent No.: US 9,351,067 B2
(45) Date of Patent: May 24, 2016

(54) ACOUSTIC GENERATOR, ACOUSTIC GENERATION DEVICE, AND ELECTRONIC APPARATUS

(71) Applicant: KYOCERA Corporation, Kyoto-shi, Kyoto (JP)

(72) Inventors: Satoru Kamitani, Kirishima (JP); Shigenobu Nakamura, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/406,344

(22) PCT Filed: May 31, 2013

(86) PCT No.: PCT/JP2013/065291
§ 371 (c)(1),
(2) Date: Dec. 8, 2014

(87) PCT Pub. No.: WO2014/045645
PCT Pub. Date: Mar. 27, 2014

(65) Prior Publication Data
US 2015/0125009 A1 May 7, 2015

(30) Foreign Application Priority Data
Sep. 21, 2012 (JP) ................. 2012-208705

(51) Int. Cl.
| | |
|---|---|
| *H04R 1/28* | (2006.01) |
| *H04R 7/04* | (2006.01) |
| *H04R 17/00* | (2006.01) |
| *H01L 41/31* | (2013.01) |
| *H04R 17/10* | (2006.01) |

(Continued)

(52) U.S. Cl.
CPC ............. *H04R 1/2876* (2013.01); *H04R 1/28* (2013.01); *H04R 7/04* (2013.01); *H04R 7/045* (2013.01);

(Continued)

(58) Field of Classification Search
CPC .............. H04R 7/02; H04R 7/04; H04R 7/06; H04R 7/10; H04R 17/00; H04R 17/005; H04R 17/02; H04R 17/025; H04R 17/10; H04R 2440/05; H04R 2440/07; H04R 1/2869–1/288; H04R 1/2892; H04R 1/2896; H01L 41/053; H01L 41/0533; H01L 41/0815; H01L 41/31; H01L 41/311; H01L 41/312; H01L 41/313
See application file for complete search history.

(56) References Cited

U.S. PATENT DOCUMENTS 4,228,379 A * 10/1980 Guscott .................. H04R 17/10
310/322
7,126,261 B2 * 10/2006 Shibata ............... H01L 41/0926
29/25.35

(Continued)

FOREIGN PATENT DOCUMENTS

| | | | |
|---|---|---|---|
| JP | 2001-285994 A | * 10/2001 | ............. H04R 17/00 |
| JP | 2004-023436 A | 1/2004 | |
| JP | 2010-103977 A | 5/2010 | |

OTHER PUBLICATIONS

International Search Report, PCT/JP2013/065291, Jul. 4, 2013, 1 pg.

(Continued)

*Primary Examiner* — Curtis Kuntz
*Assistant Examiner* — Joshua Kaufman
(74) *Attorney, Agent, or Firm* — Volpe and Koenig, P.C.

(57) ABSTRACT

An acoustic generator disclosed herein includes: an exciter which vibrates by an electric signal being input; and a film-shaped vibrating body to which the exciter is bonded via a bonding material and which vibrates together with the exciter by the vibration of the exciter, wherein the bonding material has a protruded part which protrudes from an outer edge of the exciter when the vibrating body is viewed in plane, at least a part of the protruded part has an undulating shape so as to be different from a shape of the outer edge of the exciter, and a part without the bonding material is provided between the exciter and the vibration body.

9 Claims, 14 Drawing Sheets

(52) U.S. Cl.
CPC ............... *H01L 41/31* (2013.01); *H04R 1/288* (2013.01); *H04R 17/00* (2013.01); *H04R 17/10* (2013.01); *H04R 2440/05* (2013.01)

(56) References Cited

U.S. PATENT DOCUMENTS

| | | | | |
|---|---|---|---|---|
| 7,942,056 B2 * | 5/2011 | Mutharasan | ............ | G01H 11/08 73/579 |
| 8,171,795 B1 * | 5/2012 | Mutharasan | ............ | G01H 11/08 73/579 |
| 8,369,544 B2 * | 2/2013 | Andersen | ............... | H04R 17/02 29/594 |
| 2004/0027035 A1 * | 2/2004 | Namerikawa | ....... | H01L 41/0831 310/367 |
| 2015/0003643 A1 * | 1/2015 | Terazono | ................. | H04R 1/00 381/162 |

OTHER PUBLICATIONS

Taiwanese Office Action with concise English explanation, Taiwan Patent Application No. 102133757, Mar. 9, 2015, 6 pgs.

* cited by examiner

ACOUSTIC GENERATOR, ACOUSTIC GENERATION DEVICE, AND ELECTRONIC APPARATUS

CROSS-REFERENCE TO RELATED APPLICATIONS

This application is national stage application of International Application No. PCT/JP2013/065291, filed on May 31, 2013, which designates the United States, incorporated herein by reference, and which claims the benefit of priority from Japanese Patent Application No. 2012-208705, filed on Sep. 21, 2012, the entire contents of which are incorporated herein by reference.

FIELD

The present invention relates to an acoustic generator including an exciter which vibrates by an electric signal being input, an acoustic generation device, and an electronic apparatus.

BACKGROUND

Conventionally, an acoustic generator represented by a piezoelectric speaker is known as small-sized and low-current drive acoustic equipment in which a piezoelectric body is used for an electro-acoustic conversion element. The acoustic generator is used, for example, as an acoustic generation device incorporated in a small-sized electronic apparatus such as a mobile computing device.

Generally, the acoustic generator, in which the piezoelectric body is used for the electro-acoustic conversion element, has a structure in which a piezoelectric element with an electrode made of a thin silver film and the like formed thereon, is attached to a metallic vibration plate by an adhesive. In a sound generation mechanism of the acoustic generator in which the piezoelectric body is used for the electro-acoustic conversion element, an alternate-current voltage is applied to both surfaces of the piezoelectric element so that the form distortion occurs in the piezoelectric element, and the form distortion of the piezoelectric element is transmitted to the metallic vibration plate and vibrates it, whereby sound is generated (for example, see Patent Literature 1 and 2).

CITATION LIST

Patent Literature

Patent Literature 1: JP 2004-023436 A
Patent Literature 2: JP 2001-285994 A

SUMMARY

Technical Problem

However, in the above-described acoustic generator, there is a problem that a peak dip easily occurs due to the resonance induced by the vibration of the piezoelectric element, and the acoustic pressure rapidly changes at a specific frequency. Therefore, it is necessary to flatten the frequency characteristics.

The technology disclosed has been made in view of the above, and an object thereof is to provide an acoustic generator, an acoustic generation device, and an electronic apparatus which make it possible to flatten the frequency characteristics of the acoustic pressure.

Solution to Problem

An acoustic generator, an acoustic generation device, and an electronic apparatus according to an aspect of embodiment comprising: an exciter which vibrates by an electric signal being input; and a film-shaped vibrating body to which the exciter is bonded via a bonding material and which vibrates together with the exciter by the vibration of the exciter, wherein the bonding material has a protruded part which protrudes from an outer edge of the exciter when the vibrating body is viewed in plane, and at least a part of the protruded part has an undulating shape.

Advantageous Effects of Invention

According to an aspect of an acoustic generator, an acoustic generation device, and an electronic apparatus disclosed in the present invention, an effect of flattening the frequency characteristics can be achieved.

DESCRIPTION OF EMBODIMENTS

Hereinafter, embodiments of an acoustic generator, an acoustic generation device, and an electronic apparatus disclosed in the present invention will be described in detail with reference to the drawings. The embodiments are not intended to limit the present invention. The embodiments exemplified below can be suitably combined as long as there are no contradictions of the shape or size of each member included in the acoustic generator.

First Embodiment

Structure of Acoustic Generator

Figure 1A:
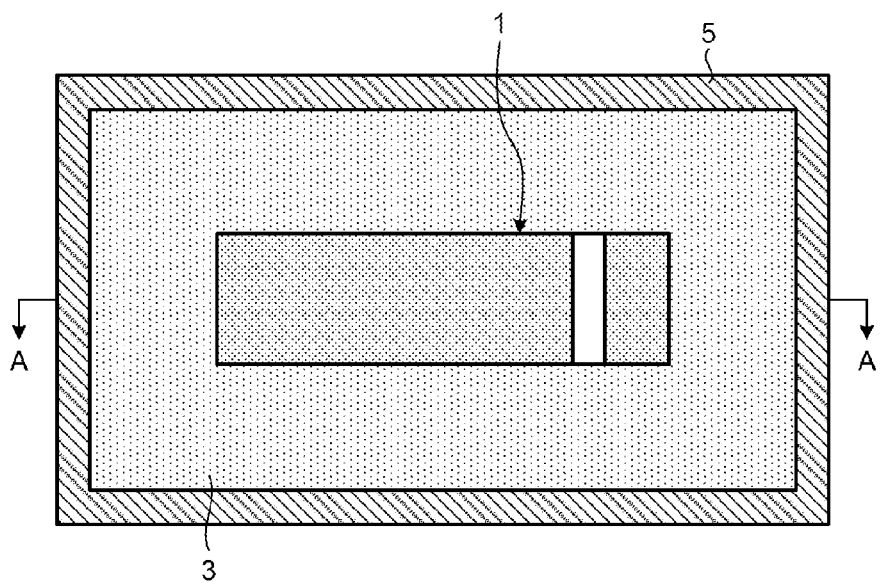
FIG. 1A is a plan view illustrating an acoustic generator according to a first embodiment.
Figure 1B:
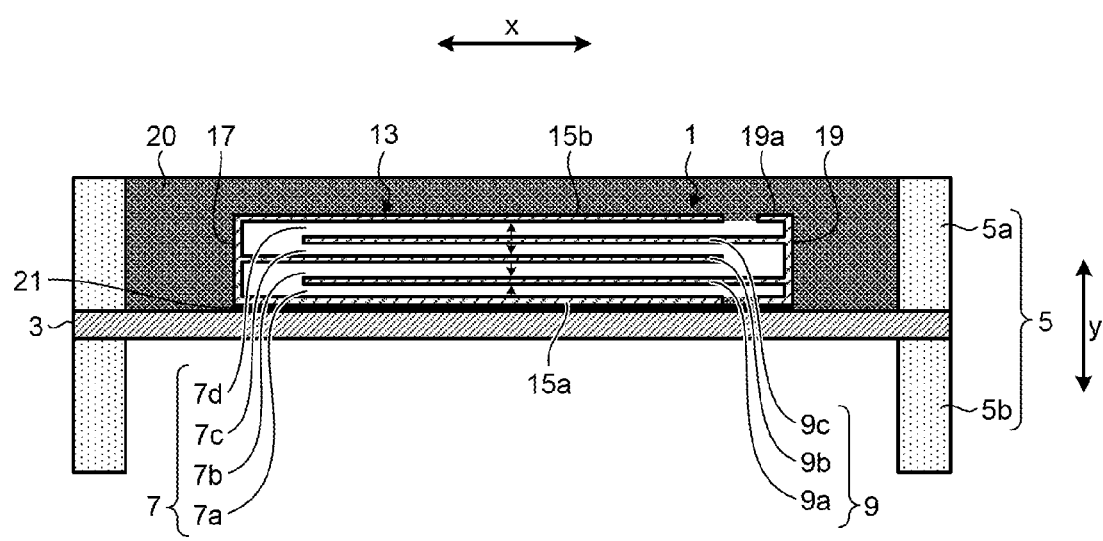
FIG. 1B is a cross-sectional view illustrating the acoustic generator according to the first embodiment.

First, an example of an acoustic generator will be described with reference to FIGS. 1A and 1B. FIG. 1A is a plan view illustrating the acoustic generator. FIG. 1B is a cross-sectional view taken along a line A-A illustrated in FIG. 1A. In FIG. 1B, a thickness direction (y-direction) of a lamination-type piezoelectric element 1 illustrated as an exciter 1 is illustrated in an enlarged manner in order to facilitate understanding.

The exciter applicable to the acoustic generator of the present embodiment may be, in addition to the piezoelectric element as described below, for example, an electrodynamic exciter, an electrostatic exciter, or an electromagnetic exciter known as the exciter which vibrates a speaker, as long as it has a function of exciting by an electric signal being input. Here, the electrodynamic exciter vibrates a coil by flowing current to the coil arranged between two magnetic poles of a permanent magnet. The electrostatic exciter vibrates a metallic plate by flowing a bias and an electric signal to two facing metallic plates. The electromagnetic exciter vibrates a thin iron plate by flowing an electric signal to a coil. In the present embodiment, a film 3 is exemplified as a vibrating body 3.

The acoustic generator illustrated in FIGS. 1A and 1B has a configuration in which the piezoelectric element 1, as the exciter which vibrates by an electric signal being input, is bonded on the film-shaped vibrating body 3 by a bonding material 21. In this case, the vibrating body 3 vibrates together with the piezoelectric element 1 by the vibration of the piezoelectric element 1 as the exciter. The film 3 may be, for example, attached to a frame member 5 which is square with its central region being opened. In this acoustic generator, as illustrated in FIG. 1B, the film 3 is fixed to first and second frame members 5a, 5b by sandwiching the film 3, to which tension is being applied, between the first and second frame members 5a, 5b. The lamination-type piezoelectric element 1 is arranged on the upper surface of this film 3. Although the frame member 5 may have a configuration in which the film 3 is held between a pair of frame members 5 as illustrated in FIG. 1B, the frame member 5 preferably has a configuration in which the frame member 5 is only attached to one principal surface side of the film 3 in that the height reduction and cost reduction of the acoustic generator can be achieved.

Among them, the piezoelectric element 1 is formed, for example, in a plate shape, and the upper and lower principal surfaces have any one of a square shape, a rectangular shape, a polygonal shape, and a shape with curved parts in an outer periphery. Such piezoelectric element 1 as the exciter has, for example, a laminate 13, surface electrode layers 15a, 15b, and a pair of external electrodes 17, 19. In the laminate 13, a piezoelectric layer 7 including four ceramic layers and an internal electrode layer 9 including three layers are alternately laminated. The surface electrode layers 15a, 15b are formed on the upper and lower surfaces of this laminate 13. The external electrodes 17, 19 are respectively provided at both ends in a longitudinal direction x of the laminate 13.

The external electrode 17 is connected to the surface electrode layers 15a, 15b, and an internal electrode layer 9b. The external electrode 19 is connected to two internal electrode layers 9a, 9c. The piezoelectric layer 7 has been polarized as illustrated by the arrows in FIG. 1B, and has a configuration in which a voltage is applied to the external electrodes 17 and 19, such that piezoelectric layers 7c, 7d extend when piezoelectric layers 7a, 7b shrink or such that the piezoelectric layers 7c, 7d shrink when the piezoelectric layers 7a, 7b extend.

The upper and lower ends of the external electrode 19 extend to the upper and lower surfaces of the laminate 13 and turnover external electrodes 19a are respectively formed thereon. These turnover external electrodes 19a extend with a predetermined distance from the surface electrode layers 15a, 15b so as not to contact the surface electrode layers 15a, 15b formed on the surfaces of the laminate 13.

The above-described piezoelectric layer 7 including four layers and the above-described internal electrode layer 9 including three layers are formed by being simultaneously burned in a laminated state. The surface electrode layers 15a, 15b are formed by fabricating the laminate 13 and then applying paste thereto and burning it.

The principal surface of the piezoelectric element 1 as the exciter on the side of the film 3 and the film 3 are bonded by the bonding material 21. The thickness of the bonding material 21 between the piezoelectric element 1 as the exciter and the film 3 is, for example, 0.02 µm or more and 20 µm or less, more desirably 10 µm or less. When the thickness of the bonding material 21 is 20 µm or less, the vibration of the laminate 13 is easily transmitted to the film 3.

Known adhesives such as an epoxy-based resin, silicon-based resin, or polyester-based resin can be used to form the bonding material 21. The vibrating body can be fabricated by using any method such as heat hardening, light hardening, or anaerobic hardening as a method of hardening the resin used for the adhesive.

In addition, in the acoustic generator according to this first embodiment, a resin layer 20 may be formed by filling the inside the frame member 5a with the resin so that the piezoelectric element 1 is buried. In FIG. 1A, the illustration of the resin layer 20 has been omitted to facilitate understanding.

An epoxy-based resin, acrylic-based resin, silicon-based resin, or rubber may be used for the resin layer 20. In addition, it is preferable that the resin layer 20 be applied such that the piezoelectric element 1 is completely covered in terms of suppression of spurious. Moreover, it is preferable that the region of the film 3 not covered with the piezoelectric element 1 be also covered with the resin layer 20 since the film 3 to be a supporting plate also vibrates together with the piezoelectric element 1.

In this manner, in the acoustic generator according to the first embodiment, a suitable damping effect can be induced for a peak dip accompanying a resonance phenomenon of the piezoelectric element 1 by burying the piezoelectric element 1 in the resin layer 20. Such damping effect can suppress the resonance phenomenon and the peak dip to be small. As a result, frequency-dependency of the acoustic pressure can be reduced.

Moreover, signal waves having non-uniform resonance frequency reflect and collide with each other inside the resin layer 20, and a peak strength at the resonance frequency is further suppressed. As a result, the frequency characteristics can be further flattened.

Existing piezoelectric ceramics such as lead zirconate (PZ), lead zirconate titanate (PZT), a Bi-layered compound, or a lead-free piezoelectric material such as a tungsten bronze structure compound may be used for the piezoelectric layer 7. It is preferable that the thickness of the piezoelectric layer 7 be 10 to 100 µm in terms of a low voltage drive.

It is desirable that the material of the internal electrode layer 9 contain a metallic component that mainly includes silver and palladium, and a material component included in the piezoelectric layer 7. The internal electrode layer 9 contains a ceramic component included in the piezoelectric layer 7 so that it is possible to reduce the stress caused by the difference in a thermal expansion between the piezoelectric layer 7 and the internal electrode layer 9. As a result, the piezoelectric element 1 without defective lamination can be obtained. The material of the internal electrode layer 9 is not limited to the metallic component that mainly includes silver and palladium, and other metallic component may be used. The ceramic component is not limited to the material component included in the piezoelectric layer 7, and other ceramic component may also be used. A method of forming the internal electrode layer 9 will be described in detail later.

It is desirable that the material of the surface electrode layers 15a, 15b and the external electrodes 17, 19 contain a glass component in the metallic component that mainly includes silver. By containing the glass component in this manner, it is possible to obtain strong adhesive force between the piezoelectric layer 7 or the internal electrode layer 9 and the surface electrode layers 15a, 15b or the external electrodes 17, 19.

The frame members 5a, 5b are, for example, made of stainless steel with a thickness of 100 to 5000 µm. The material of the frame members 5a and 5b is preferably less likely to be deformed compared with the resin layer 20, and is not limited to stainless steel. For example, a hard resin, plastic, engineering plastic, ceramic, glass, or the like may be used. In the present embodiment, the material, thickness, and the like of the frame members 5a and 5b are not particularly limited. Furthermore, the shape of the frame members 5a and 5b is also not limited to rectangular. A part or whole of an inner periphery part or an outer periphery part may be circular or elliptical, and the inner periphery part or the outer periphery part may be rhombic.

As described above, by sandwiching the outer periphery of the film 3 between the frame members 5a and 5b, the film 3 to which tension is being applied in a planar direction is fixed to the frame members 5a and 5b. As a result, the film 3 serves as a vibration plate. The thickness of the film 3 is, for example, 10 to 200 µm, and a resin such as polyethylene, polyimide, polypropylene, or polystyrene, or paper that includes pulp, fibers, or the like can be suitably used for the material of the film 3. As long as the film can be the vibration plate that is able to obtain the desired acoustic pressure characteristics, the material of the film is not limited to the organic materials described above, and a metallic material can also be applied. The use of these materials can suppress the peak dip.

[Bonding Material]

Figure 2A:
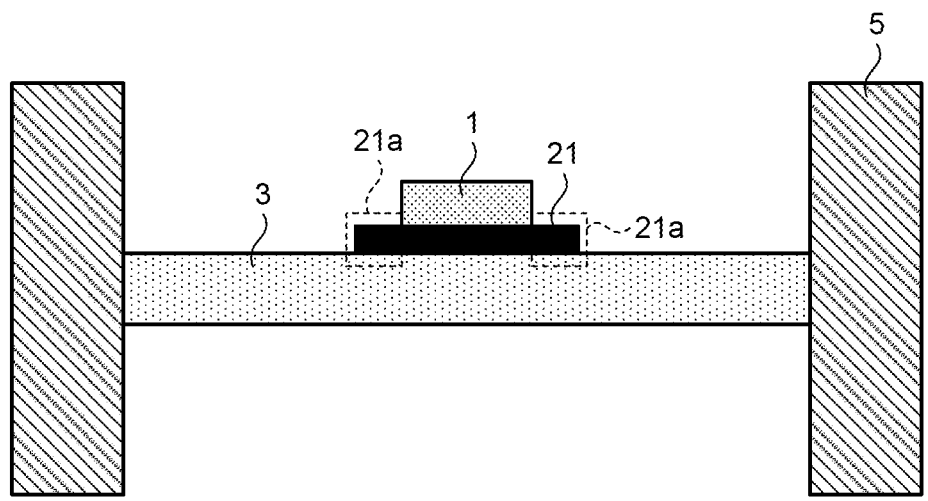
FIG. 2A is a schematic cross-sectional view of the acoustic generator according to the first embodiment.

Next, the bonding material 21 and a protruded part 21a formed thereby will be described in detail. FIG. 2A is a schematic cross-sectional view of the acoustic generator according to the first embodiment. FIG. 2A is a cross-sectional view in which a part necessary for explanation has been extracted from the cross-sectional view of FIG. 1B and illustrated so that the state of the bonding material is easily understood.

In the acoustic generator according to the present embodiment, the piezoelectric element 1 is bonded on the film 3 via the bonding material 21. This bonding material 21 has the protruded part 21a, when the film 3 is viewed in plane as illustrated in FIG. 2A, which protrudes from the part (outer edge of the piezoelectric element 1) sandwiched between the piezoelectric element 1 and the film 3. At least a part of the protruded part 21a has an undulating shape as illustrated in FIGS. 2B to 2E. In FIG. 2A, the part of the bonding material 21 surrounded by a dotted line represents the protruded part 21a. Here, an undulating part means a part in which an outer peripheral surface (outer periphery of the bonding material 21 in the plan view) is undulating by projecting and recessing. The degree (amplitude) to which the outer peripheral surface is undulating is such that the length of a perpendicular drawn from the peak of a valley positioned between adjacent crests to a line connecting the peaks of these crests is, for example, 0.1 mm or more. The length of the line connecting the peaks of adjacent crests is, for example, 0.5 mm or more.

Figure 2B:
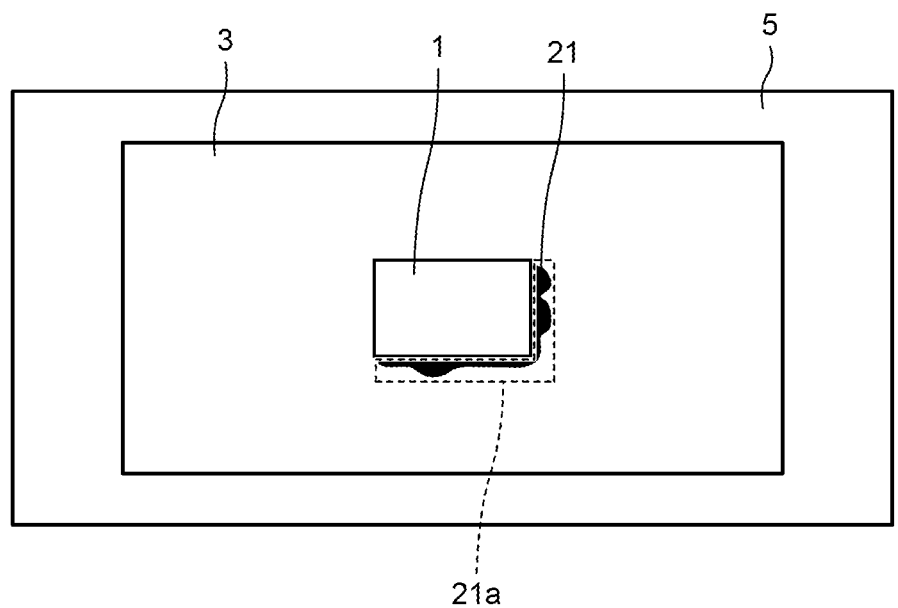
FIG. 2B is an enlarged plan view of a main part of the acoustic generator according to the first embodiment.
Figure 2C:
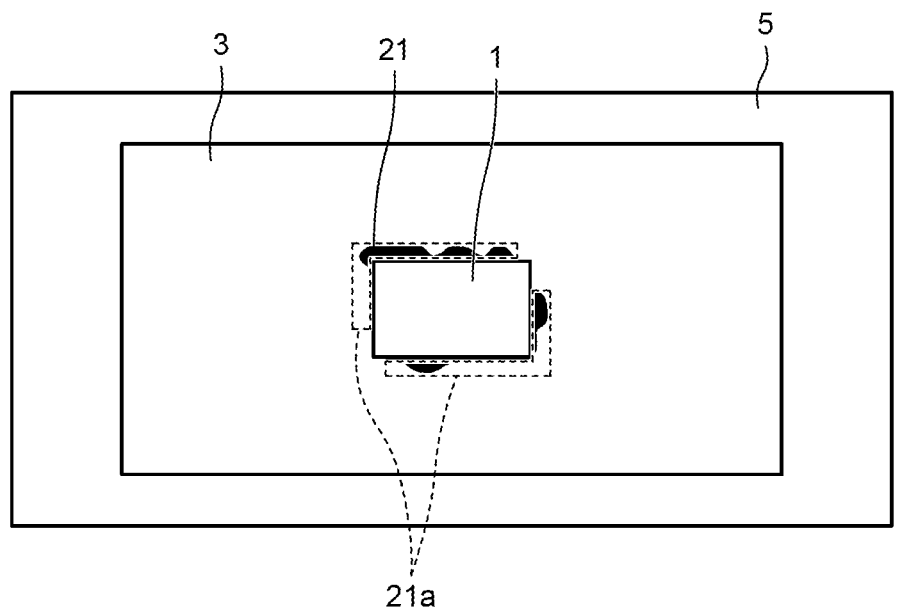
FIG. 2C is an enlarged plan view of the main part of the acoustic generator according to the first embodiment.
Figure 2D:
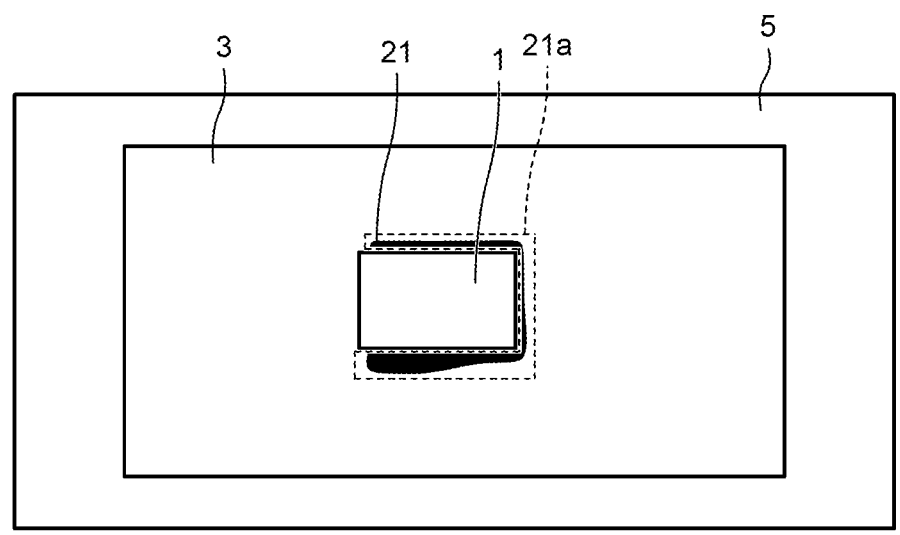
FIG. 2D is an enlarged plan view of the main part of the acoustic generator according to the first embodiment.
Figure 2E:
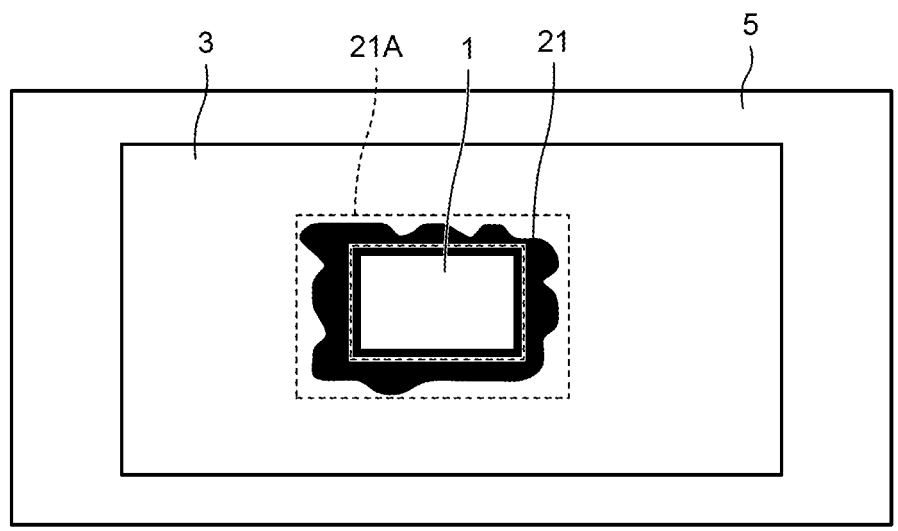
FIG. 2E is an enlarged plan view of the main part of the acoustic generator according to the first embodiment.

FIGS. 2B to 2E illustrate variations of how the protruded part 21a protrudes and the shapes at least a part of which has the undulating shape. Specifically, FIG. 2B has the protruded parts 21a which protrude on two sides out of four sides of the outer edge of the piezoelectric element 1 which is rectangular in the plan view. The protruded part 21a corresponding to each side has the undulating part. FIG. 2C has the protruded parts 21a which protrude on all of four sides of the outer edge of the piezoelectric element 1 which is rectangular in the plan view. The protruded part 21a corresponding to each side has the undulating part. FIG. 2D has the protruded parts 21a which protrude on three sides out of four sides of the outer edge of the piezoelectric element 1 which is rectangular in the plan view. The protruded part 21a corresponding to one side out of the three sides has the undulating part. FIG. 2E has the protruded parts 21a which protrude on all of four sides out of four sides of the outer edge of the piezoelectric element 1 which is rectangular in the plan view. The protruded part 21a corresponding to each side has the undulating part.

While FIGS. 2B to 2D illustrate an example including a part in which the bonding material 21 does not protrude from the outer edge of the piezoelectric element 1, FIG. 2E illustrates an example not including the part in which the bonding material 21 does not protrude from the outer edge of the piezoelectric element 1, and therefore the protruded part 21a protrudes from the whole periphery of the outer edge of the piezoelectric element 1.

With such a configuration of the bonding material 21 of the acoustic generator, the part with the bonding material 21 of the film 3 and the part without the bonding material 21 of the film 3 are formed around the piezoelectric element 1. Moreover, the undulating part in the plane view is formed on at least a part of the border. Since there is a difference in elasticity between the part in contact with the bonding material 21 of the film 3 and the part not in contact with the bonding material 21 of the film 3, the protruded part 21a of the bonding material 21 is formed outside the region sandwiched between the piezoelectric element 1 and the film 3. As a result, the resonance frequency partially varies around the piezoelectric element 1. As a result, a peak of the acoustic pressure at a resonance point can be smoothed. Here, when the undulating part is formed on the border between the part with the bonding material 21 and the part without the bonding material 21, the region in which the resonance frequency is partially different further increases. As a result, it is possible to further suppress the peak dip and to flatten the frequency characteristics.

Especially by providing a part (air gap) without the bonding material 21 between the piezoelectric element 1 and the film 3, the resonance becomes smoother. As a result, it is possible to further suppress the peak dip and to flatten the frequency characteristics.

It is desirable that the bonding material 21 be attached to the whole principal surface of the piezoelectric element 1 since the bonding material 21 can enhance the bonding property between the piezoelectric element 1 and the film 3. It is also desirable that the protruded part 21a protrude from the whole main of the outer edge of the piezoelectric element 1.

It is especially preferable that an epoxy-based resin, silicon-based resin, or acrylic-based resin be used as an adhesive to form the bonding material 21. When the adhesive including these materials is used as the bonding material 21, the adhesive strength with the film 3 increases. As a result, it is possible to improve durability of the bonding material 21 and also improve durability as the acoustic generator.

In the bonding material 21 according to the present embodiment, the length of the part which protrudes from the region sandwiched between the piezoelectric element 1 and the film 3 is preferably 0.05 mm to 2.0 mm, and more preferably 0.1 mm to 1.0 mm in the cross-section of FIG. 2A.

Second Embodiment

Figure 3A:
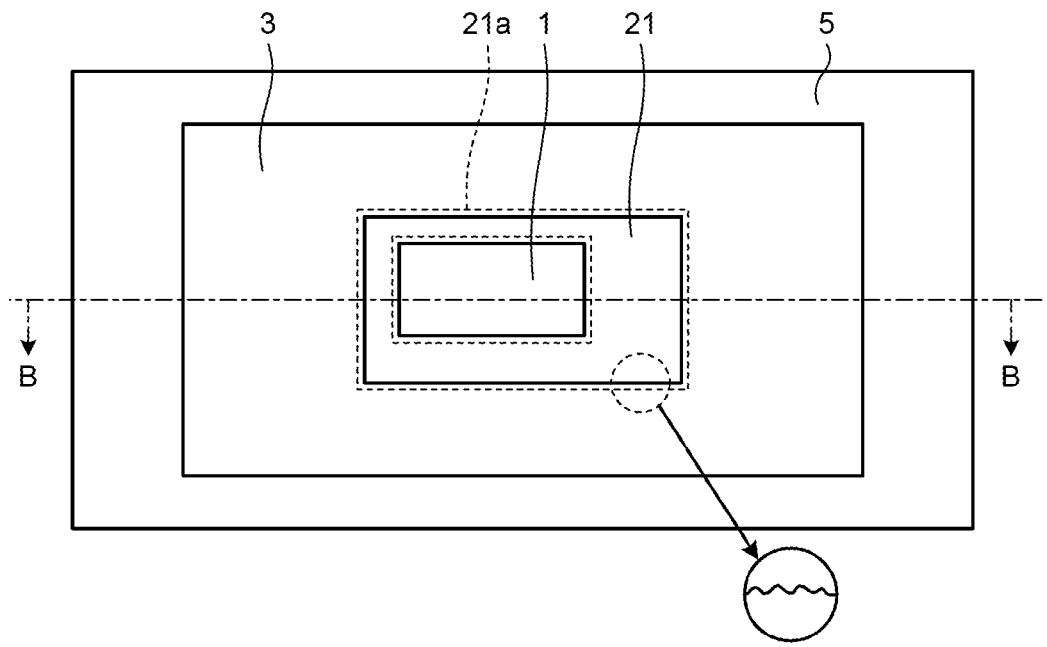
FIG. 3A is a schematic plan view of an acoustic generator according to a second embodiment illustrating an example applied to a piezoelectric element which is substantially rectangular in the plan view.
Figure 3B:
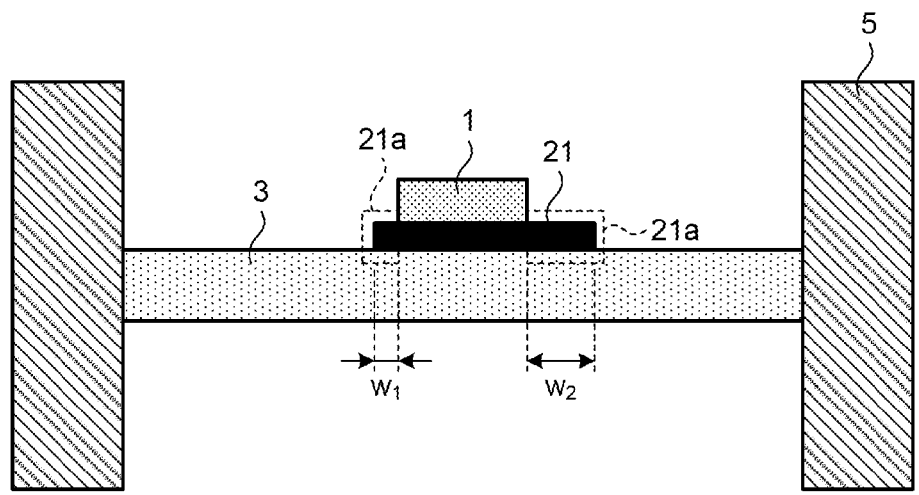
FIG. 3B is a schematic cross-sectional view of the acoustic generator according to the second embodiment illustrating the example applied to the piezoelectric element which is substantially rectangular in the plan view.
Figure 4A:
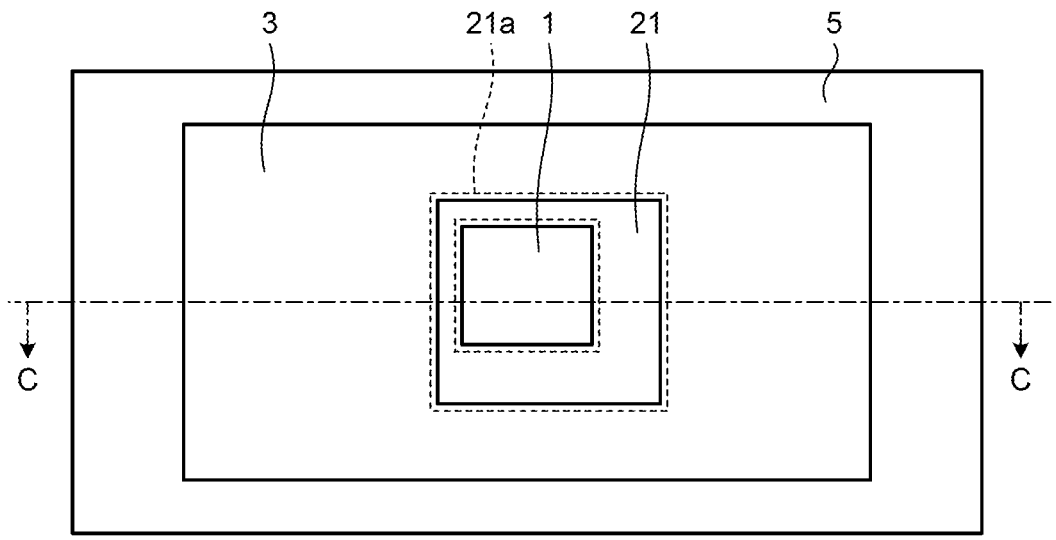
FIG. 4A is a schematic plan view of the acoustic generator according to the second embodiment illustrating an example applied to a piezoelectric element which is substantially square in the plan view.
Figure 4B:
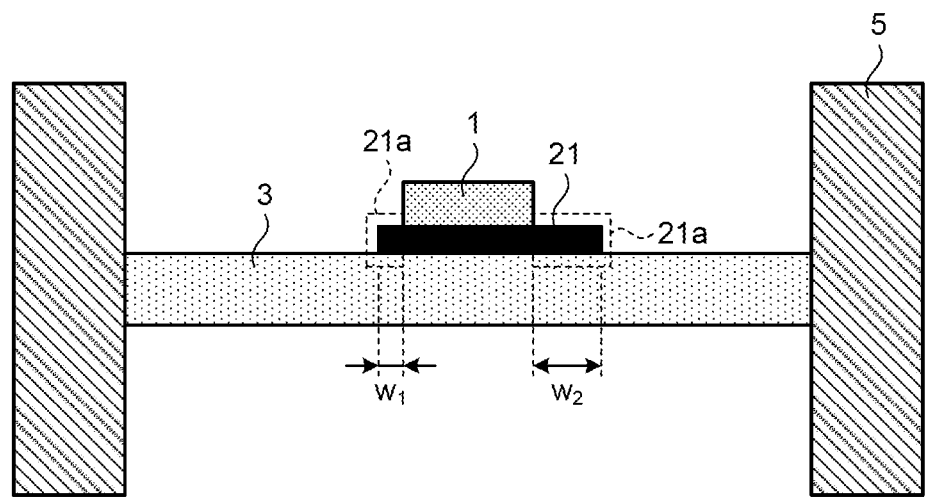
FIG. 4B is a schematic cross-sectional view of the acoustic generator according to the second embodiment illustrating the example applied to the piezoelectric element which is substantially square in the plan view.

FIG. 3A is a schematic plan view of an acoustic generator according to a second embodiment illustrating an example applied to a piezoelectric element which is substantially rectangular in the plan view. FIG. 3B is a schematic cross-sectional view of the acoustic generator according to the second embodiment illustrating the example applied to the piezoelectric element which is substantially rectangular in the plan view. FIG. 3B is a cross-sectional view taken along a line B-B illustrated in FIG. 3A. FIG. 4A is a schematic plan view of the acoustic generator according to the second embodiment illustrating an example applied to a piezoelectric element which is substantially square in the plan view. FIG. 4B is a schematic cross-sectional view of the acoustic generator according to the second embodiment illustrating the example applied to the piezoelectric element which is substantially square in the plan view. FIG. 4B is a cross-sectional view taken along a line C-C illustrated in FIG. 4A.

Figure 5A:
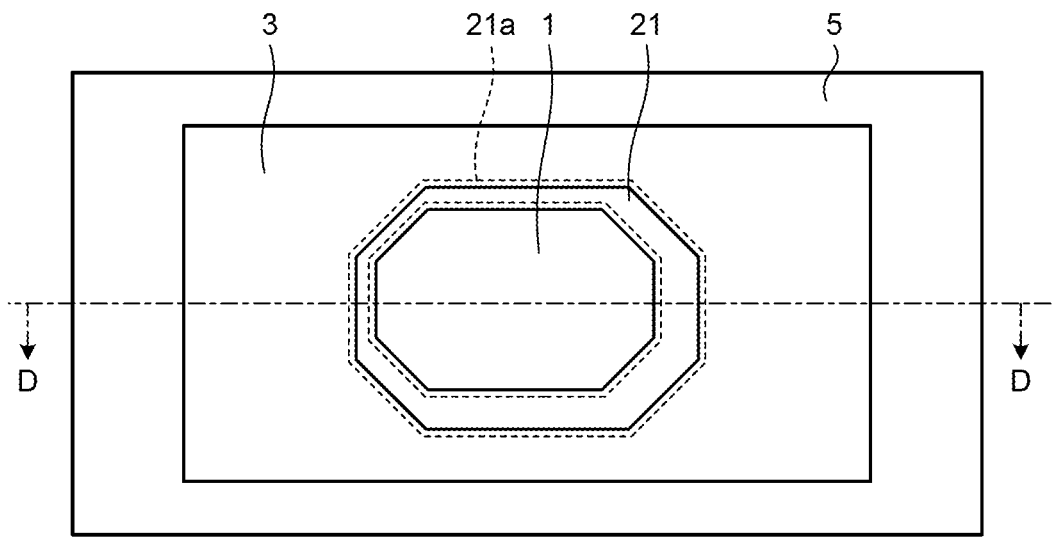
FIG. 5A is a schematic plan view of the acoustic generator according to the second embodiment illustrating an example applied to a piezoelectric element which is substantially octagonal in the plan view.
Figure 5B:
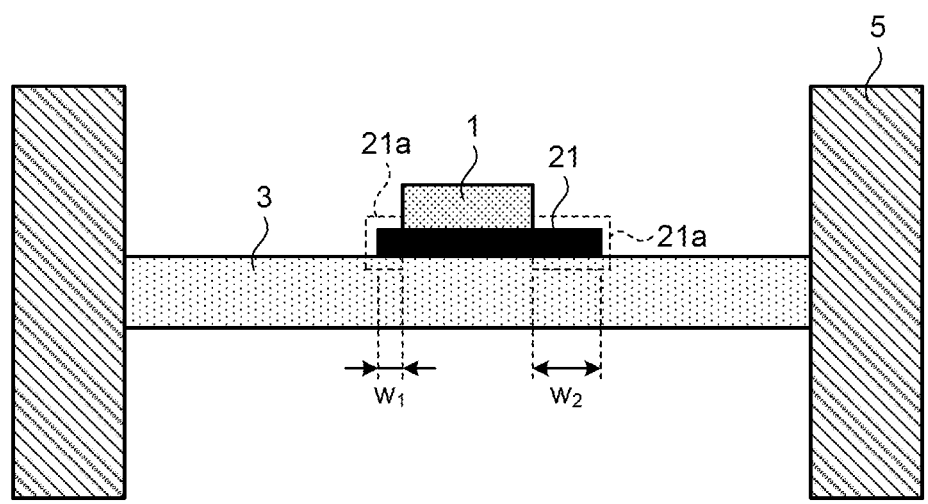
FIG. 5B is a schematic cross-sectional view of the acoustic generator according to the second embodiment illustrating the example applied to the piezoelectric element which is substantially octagonal in the plan view.
Figure 6A:
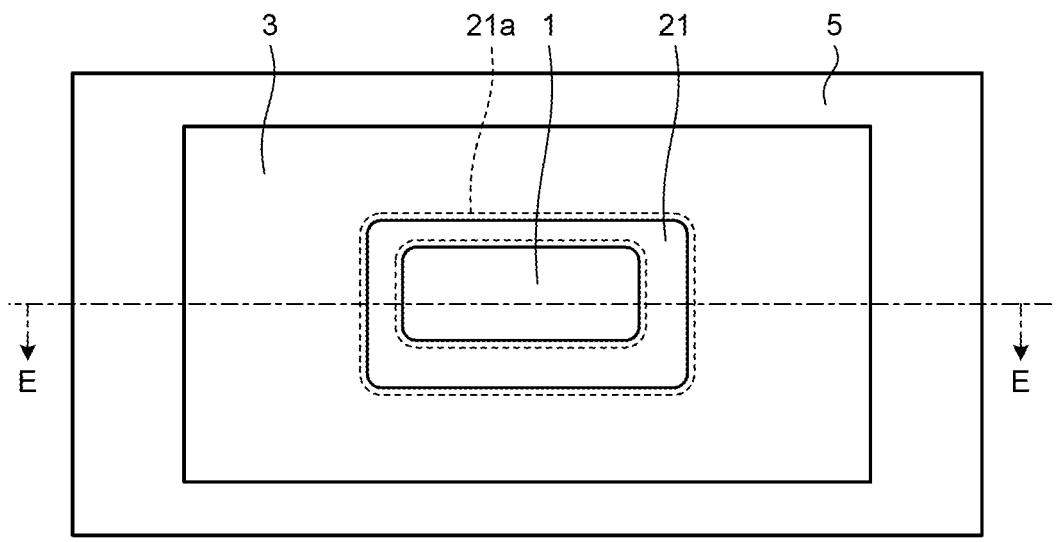
FIG. 6A is a schematic plan view of the acoustic generator according to the second embodiment illustrating an example applied to a piezoelectric element which is substantially rectangular with round corners in the plan view.
Figure 6B:
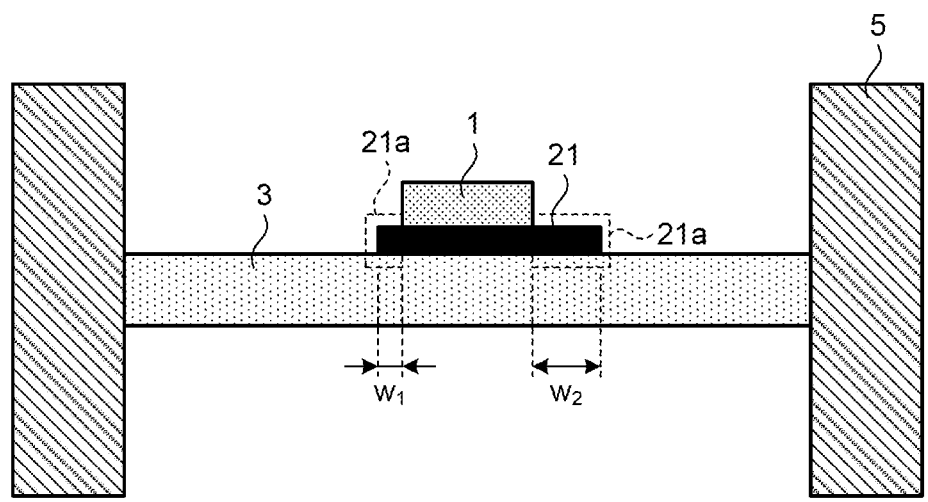
FIG. 6B is a schematic cross-sectional view of the acoustic generator according to the second embodiment illustrating the example applied to the piezoelectric element which is substantially rectangular with round corners in the plan view.

FIG. 5A is a schematic plan view of the acoustic generator according to the second embodiment illustrating an example applied to a piezoelectric element which is substantially octagonal in the plan view. FIG. 5B is a schematic cross-sectional view of the acoustic generator according to the second embodiment illustrating the example applied to the piezoelectric element which is substantially octagonal in the plan view. FIG. 5B is a cross-sectional view taken along a line D-D illustrated in FIG. 5A. FIG. 6A is a schematic plan view of the acoustic generator according to the second embodiment illustrating an example applied to a piezoelectric element which is substantially rectangular with round corners in the plan view. FIG. 6B is a schematic cross-sectional view of the acoustic generator according to the second embodiment illustrating the example applied to the piezoelectric element which is substantially rectangular with round corners in the plan view. FIG. 6B is a cross-sectional view taken along a line E-E illustrated in FIG. 6A.

Figure 7A:
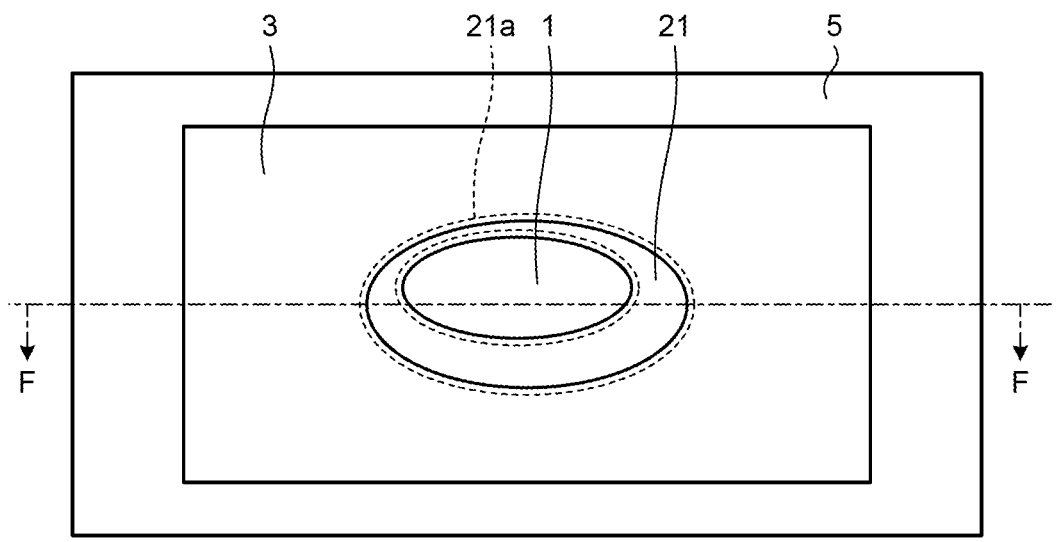
FIG. 7A is a schematic plan view of the acoustic generator according to the second embodiment illustrating an example applied to a piezoelectric element which is substantially elliptical in the plan view.
Figure 7B:
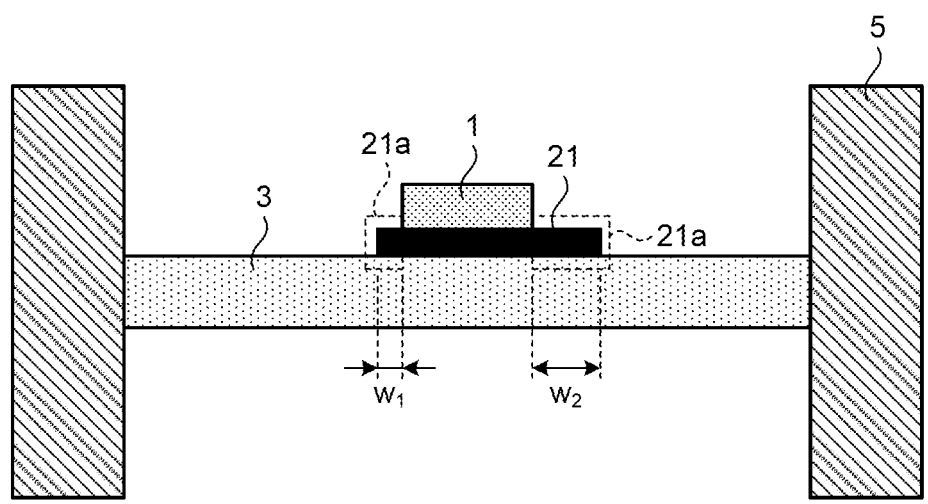
FIG. 7B is a schematic cross-sectional view of the acoustic generator according to the second embodiment illustrating the example applied to the piezoelectric element which is substantially elliptical in the plan view.
Figure 8A:
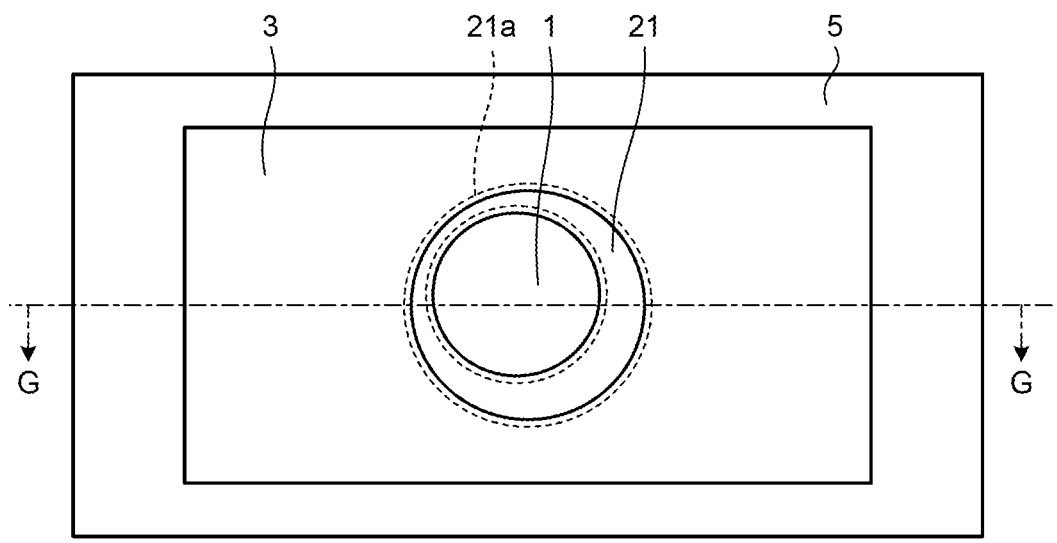
FIG. 8A is a schematic plan view of the acoustic generator according to the second embodiment illustrating an example applied to a piezoelectric element which is substantially circular in the plan view.
Figure 8B:
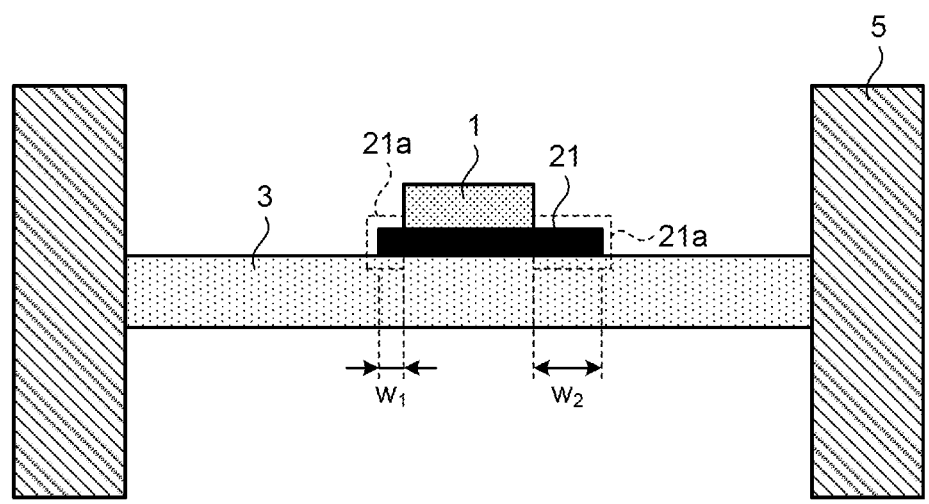
FIG. 8B is a schematic cross-sectional view of the acoustic generator according to the second embodiment illustrating the example applied to the piezoelectric element which is substantially circular in the plan view.

FIG. 7A is a schematic plan view of the acoustic generator according to the second embodiment illustrating an example applied to a piezoelectric element which is substantially elliptical in the plan view. FIG. 7B is a schematic cross-sectional view of the acoustic generator according to the second embodiment illustrating the example applied to the piezoelectric element which is substantially elliptical in the plan view. FIG. 7B is a cross-sectional view taken along a line F-F illustrated in FIG. 7A. FIG. 8A is a schematic plan view of the acoustic generator according to the second embodiment illustrating an example applied to a piezoelectric element which is substantially circular in the plan view. FIG. 8B is a schematic cross-sectional view of the acoustic generator according to the second embodiment illustrating the example applied to the piezoelectric element which is substantially circular in the plan view. FIG. 8B is a cross-sectional view taken along a line G-G illustrated in FIG. 8A.

Figure 9A:
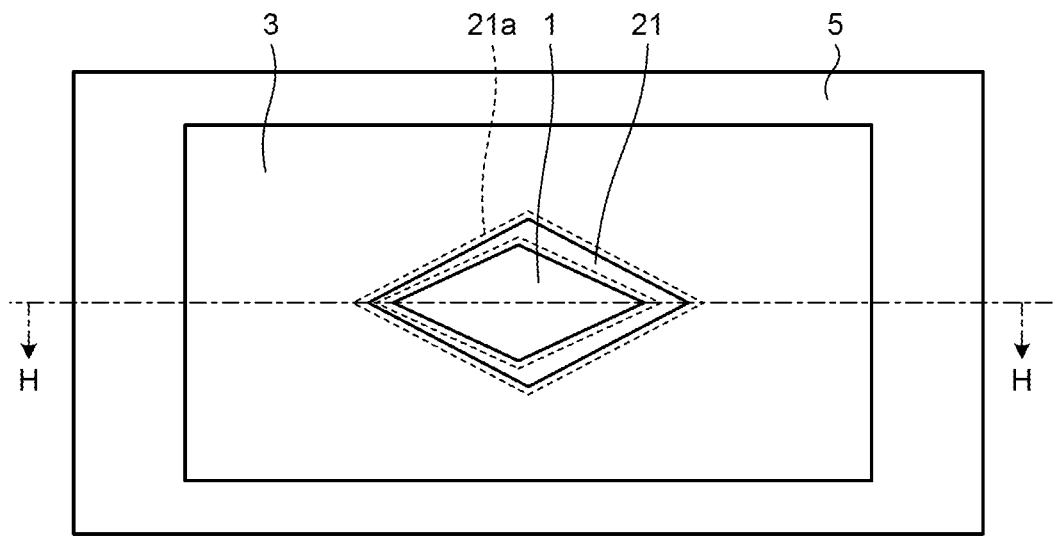
FIG. 9A is a schematic plan view of the acoustic generator according to the second embodiment illustrating an example applied to a piezoelectric element which is substantially rhombic in the plan view.
Figure 9B:
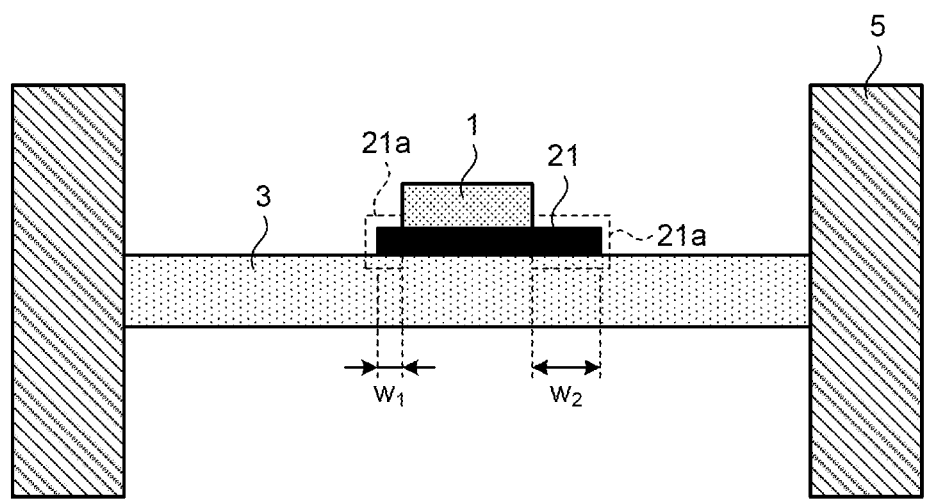
FIG. 9B is a schematic cross-sectional view of the acoustic generator according to the second embodiment illustrating the example applied to the piezoelectric element which is substantially rhombic in the plan view.
Figure 10A:
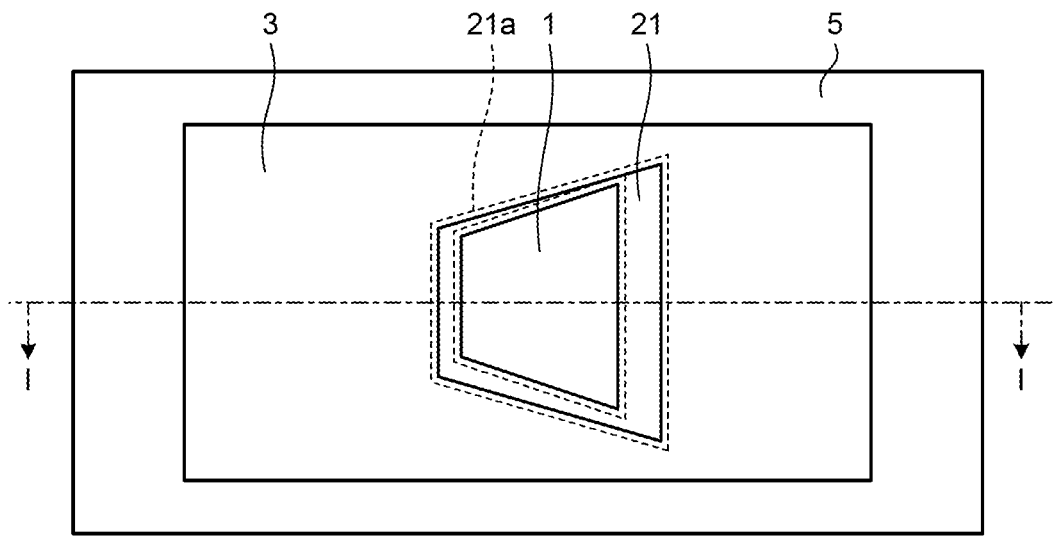
FIG. 10A is a schematic plan view of the acoustic generator according to the second embodiment illustrating an example applied to a piezoelectric element which is substantially trapezoidal in the plan view.
Figure 10B:
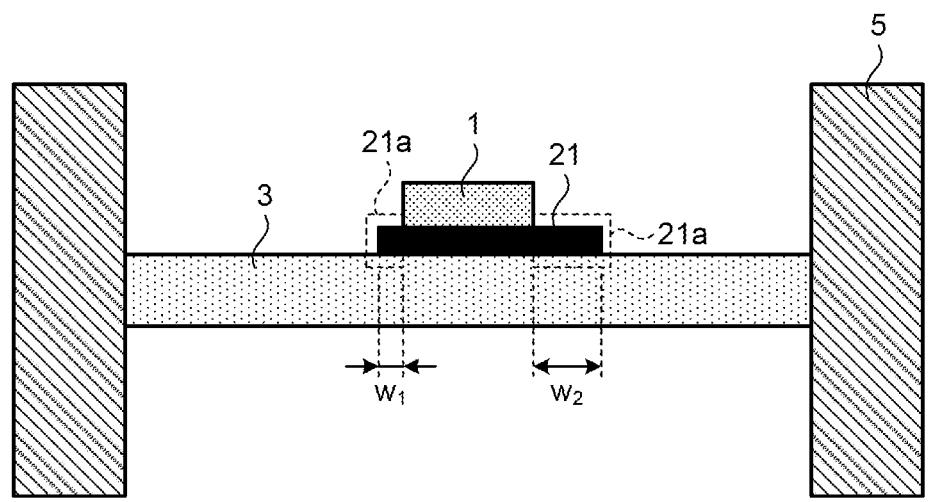
FIG. 10B is a schematic cross-sectional view of the acoustic generator according to the second embodiment illustrating the example applied to the piezoelectric element which is substantially trapezoidal in the plan view.
Figure 11A:
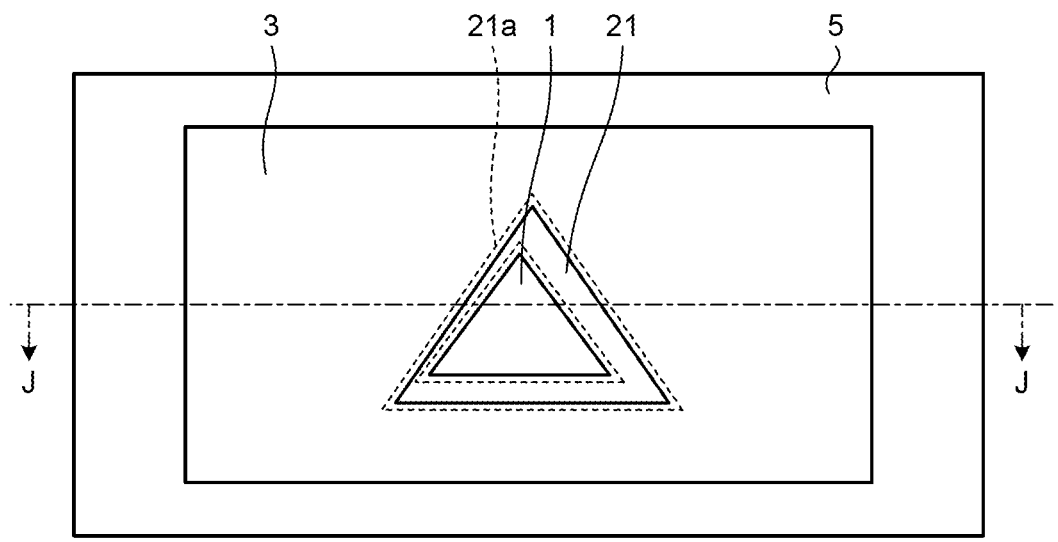
FIG. 11A is a schematic plan view of the acoustic generator according to the second embodiment illustrating an example applied to a piezoelectric element which is substantially triangular in the plan view.
Figure 11B:
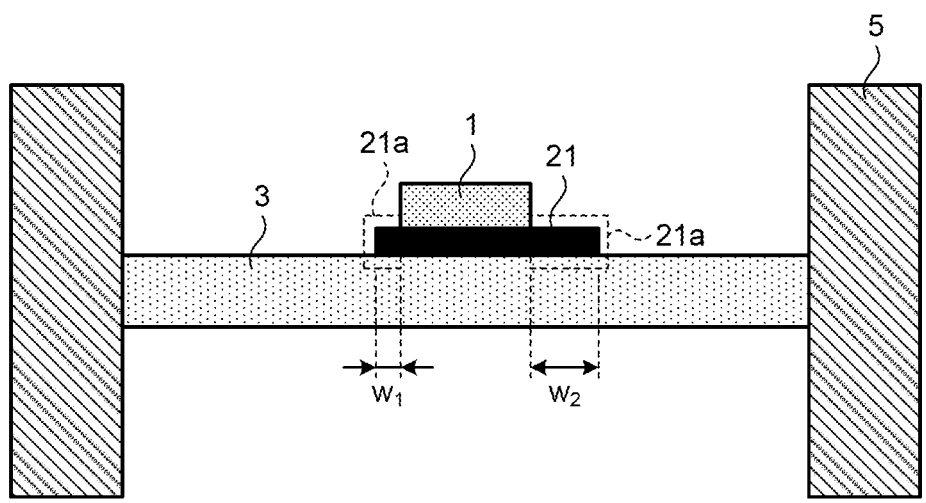
FIG. 11B is a schematic cross-sectional view of the acoustic generator according to the second embodiment illustrating the example applied to the piezoelectric element which is substantially triangular in the plan view.

FIG. 9A is a schematic plan view of the acoustic generator according to the second embodiment illustrating an example applied to a piezoelectric element which is substantially rhombic in the plan view. FIG. 9B is a schematic cross-sectional view of the acoustic generator according to the second embodiment illustrating the example applied to the piezoelectric element which is substantially rhombic in the plan view. FIG. 9B is a cross-sectional view taken along a line H-H illustrated in FIG. 9A. FIG. 10A is a schematic plan view of the acoustic generator according to the second embodiment illustrating an example applied to a piezoelectric element which is substantially trapezoidal in the plan view. FIG. 10B is a schematic cross-sectional view of the acoustic generator according to the second embodiment illustrating the example applied to the piezoelectric element which is substantially trapezoidal in the plan view. FIG. 10B is a cross-sectional view taken along a line I-I illustrated in FIG. 10A. FIG. 11A is a schematic plan view of the acoustic generator according to the second embodiment illustrating an example applied to a piezoelectric element which is substantially triangular in the plan view. FIG. 11B is a schematic cross-sectional view of the acoustic generator according to the second embodiment illustrating the example applied to the piezoelectric element which is substantially triangular in the plan view. FIG. 11B is a cross-sectional view taken along a line J-J illustrated in FIG. 11A.

Next, the acoustic generator according to the second embodiment will be described with reference to FIGS. 3A to 11B. FIGS. 3B to 11B are also cross-sectional views like FIG. 2A in which a part necessary for explanation has been extracted and illustrated. In FIGS. 3A to 11A, the part of a bonding material 21 sandwiched between dotted lines corresponds to a protruded part 21a. In FIGS. 3B to 11B, the part of the bonding material 21 surrounded by a dotted line corresponds to the protruded part 21a. Although FIGS. 4A to 11B do not indicate that at least a part of the protruded part 21a has the undulating shape, the undulating shape has been formed at least in a part as illustrated by a leading line in FIG. 3A.

In the acoustic generator according to the second embodiment, it is preferable that widths of the protruded parts 21a on both sides of the piezoelectric element 1 (exciter) differ when the piezoelectric element 1 as the exciter is viewed in the cross-section (when the piezoelectric element 1 is viewed in the cross-section perpendicular to the main surface of a film 3) from the direction parallel with the principal surface of the film 3 as the vibrating body.

As illustrated in FIGS. 3A to 11B, in these acoustic generators, the widths of the protruded parts 21a on both sides of the piezoelectric element 1 differ. Therefore, in the following description, the protruded part 21a will be mainly described and the description of each part having the same function as the first embodiment will be omitted.

In the acoustic generator according to the second embodiment, the protruded parts 21a protrude bilaterally unsymmetrically from the part sandwiched between the piezoelectric element 1 and the film 3 as illustrated in FIGS. 3A to 11B.

Here, when the piezoelectric element 1 as the exciter is viewed in the cross-section perpendicular to the main surface of the film 3 as the vibrating body, and the cross-sectional areas of the protruded parts 21a on both sides of the piezoelectric element 1 differ, the amplitudes of the film 3 that vibrates by the vibration of the piezoelectric element 1 will differ between the right and left sides of the piezoelectric element 1. By this, a peak of the acoustic pressure at a resonance point can be smoother. As a result, it is possible to further suppress a peak dip and to flatten the frequency characteristics.

Especially when the widths w ($w_1$, $w_2$) of the protruded parts 21a are made to differ between the right and left sides of the piezoelectric element 1, regions which vibrate according to the amplitudes of the film 3 that vibrates by the vibration of the piezoelectric element 1 will differ between the right and left sides of the piezoelectric element 1. By this, a peak of the acoustic pressure at a resonance point can be smoother. As a result, it is possible to further suppress a peak dip and to flatten the frequency characteristics.

In this case, the difference between the widths w ($w_1$, $w_2$) of the protruded parts 21a is preferably 0.5 mm or more. It is preferable that the shape of the principal surface of the piezoelectric element 1 be rectangular because the variation in acoustic pressure can be reduced over a broad frequency band.

Third Embodiment

Figure 12:
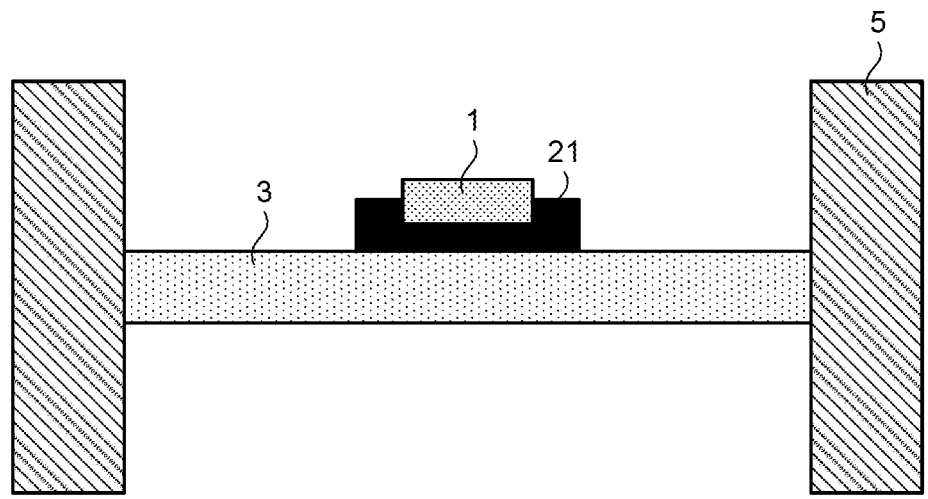
FIG. 12 is a schematic cross-sectional view of an acoustic generator according to a third embodiment.

Next, an acoustic generator according to a third embodiment will be described with reference to FIG. 12. FIG. 12 is a schematic cross-sectional view of the acoustic generator according to the third embodiment. FIG. 12 is also a cross-sectional view like FIG. 2A in which a part necessary for explanation has been extracted and illustrated. In the acoustic generator according to the third embodiment, the way a protruded part 21a protrudes differs from those of the first and second embodiments. Therefore, in the following description, the protruded part 21a will be mainly described and the description of each part having the same function as the first and second embodiments will be omitted.

In the acoustic generator according to the present embodiment, it is desirable that the protruded parts 21a extend to the side face of a piezoelectric element 1 as an exciter. In this case, the protruded parts 21a protrude from the part sandwiched between the piezoelectric element 1 and a film 3 as illustrated in FIG. 12, further extend to the sides of the piezoelectric element 1, and are attached thereto. In this case also, the protruded parts 21a may be bilaterally symmetrical in the cross-section, but are not limited thereto and may be bilaterally unsymmetrical. In this case, "bilaterally unsymmetrical" means that lengths in a direction from the piezoelectric element 1 to a frame member 5 may differ, and heights covering the side face of the piezoelectric element 1 may differ.

In this manner, when the protruded parts 21a extend to the side face of the piezoelectric element 1, the adhesive strength between a piezoelectric layer 7 and an external electrode can be enhanced. As a result, the durability of the piezoelectric element 1 can be improved. In this case, it is preferable that the protruded parts 21a cover the whole periphery of the side face of the piezoelectric element 1.

Fourth Embodiment

Figure 13:
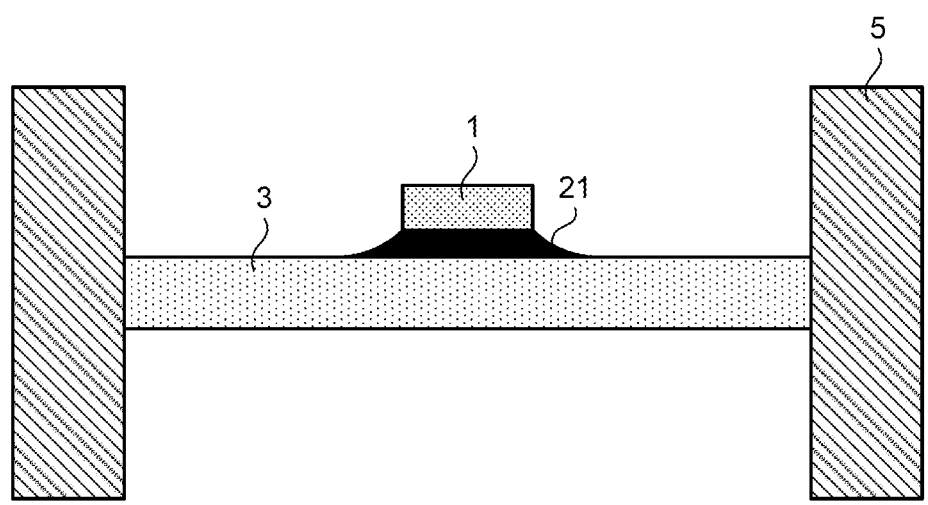
FIG. 13 is a schematic cross-sectional view of an acoustic generator according to a fourth embodiment.

Next, an acoustic generator according to a fourth embodiment will be described with reference to FIG. 13. FIG. 13 is a schematic cross-sectional view of the acoustic generator according to the fourth embodiment. FIG. 13 is also a cross-sectional view like FIG. 2A in which a part necessary for explanation has been extracted and illustrated. In the acoustic generator according to the fourth embodiment, the way a protruded part 21a protrudes differs from those of the first to third embodiments. Therefore, in the following description, the protruded part 21a will be mainly described and the description of each part having the same function as the first to third embodiments will be omitted.

In the acoustic generator according to the present embodiment, it is desirable that the protruded parts 21a be formed in meniscus shape from the sides of a piezoelectric element 1 as an exciter to a film 3 as a vibration plate.

In this manner, when the protruded parts 21a are in meniscus shape, the thickness of the protruded parts 21a gradually changes from the piezoelectric element 1 toward the film 3. As a result, the adhesive strength between the protruded parts 21a and the film 3 increases, and at the same time the transmission of the vibration of the piezoelectric element 1 to the film 3 becomes gentle. Therefore, it is possible to flatten the frequency characteristics of the acoustic pressure.

Here, widths of the protruded parts 21a are described as being bilaterally symmetrical in FIG. 13, but are not limited thereto and may be bilaterally unsymmetrical as the second embodiment.

While the embodiments have been described, the present embodiments may be performed in a variety of different forms other than those described above. Therefore, other forms included in the present embodiments will be described hereinafter.

[Applicable Range]

For example, although a bimorph-type piezoelectric element has been exemplified in the above-described first embodiment, the present invention is not limited thereto. That is, the present invention is not limited to the case where the piezoelectric element is of the bimorph-type, and the same effect can be obtained by a unimorph-type by applying the adhesive layer same as the above-described first to fourth embodiments.

[Speaker Device]

The acoustic generator described in the above first to fourth embodiments can constitute an acoustic generation device, so-called "speaker device", by being housed in a housing for housing the acoustic generator, so-called resonant box. The acoustic generator can constitute a large-sized speaker device used for a television, personal computer, and the like, as well as a medium-sized or small-sized speaker device mounted on a mobile terminal such as a smartphone, mobile phone, personal handy phone system (PHS), and personal digital assistants (PDA). The speaker device is not limited to the above usage, and can include the speaker mounted on any electronic apparatus such as a cleaner, washing machine, or refrigerator.

[Electronic Apparatus]

In addition, the acoustic generators described in the above first to fourth embodiments have at least an electronic circuit connected to the acoustic generator and a housing for housing the electronic circuit and the acoustic generator, and can also constitute an electronic apparatus which has a function of generating sound from the acoustic generator. Examples of such an electronic apparatus include a television, personal computer, and various mobile terminals, as well as a cleaner, washing machine, or refrigerator.

REFERENCE SIGNS LIST

1 PIEZOELECTRIC ELEMENT
3 FILM
5, 5a, 5b FRAME MEMBER
7, 7a, 7b, 7c, 7d PIEZOELECTRIC LAYER
9, 9a, 9b, 9c INTERNAL ELECTRODE LAYER
13 LAMINATE
15a, 15b SURFACE ELECTRODE LAYER
17, 19 EXTERNAL ELECTRODE
20 RESIN LAYER
21 BONDING MATERIAL
21a PROTRUDED PART
x LONGITUDINAL DIRECTION OF LAMINATE
y THICKNESS DIRECTION OF PIEZOELECTRIC ELEMENT

The invention claimed is:

1. An acoustic generator comprising:
an exciter which vibrates by an electric signal being input; and
a film-shaped vibrating body to which the exciter is bonded via a bonding material and which vibrates together with the exciter by the vibration of the exciter,
wherein the bonding material has a protruded part which protrudes from an outer edge of the exciter when the vibrating body is viewed in plane, at least a part of the protruded part has an undulating shape so as to be different from a shape of the outer edge of the exciter, and
a part without the bonding material is provided between the exciter and the vibrating body.

2. The acoustic generator according to claim 1, wherein cross-sectional areas of the protruded part differ between both sides of the exciter when the exciter is viewed in the cross-section perpendicular to a main surface of the vibrating body.

3. The acoustic generator according to claim 2, wherein the protruded part extends to a side of the exciter.

4. The acoustic generator according to claim 1, wherein widths of the protruded part differ between both sides of the exciter when the exciter is viewed in the cross-section perpendicular to a main surface of the vibrating body.

5. The acoustic generator according to claim 4, wherein the protruded part extends to a side of the exciter.

6. The acoustic generator according to claim 1, wherein the protruded part extends to a side face of the exciter.

7. The acoustic generator according to claim 6, wherein the protruded part is formed in meniscus shape from the side face of the exciter to the vibrating body.

8. An acoustic generation device comprising:
the acoustic generator according to claim 1; and
a housing that houses the acoustic generator.

9. An electronic apparatus comprising:
the acoustic generator according to claim 1;
an electronic circuit connected to the acoustic generator; and
a housing that houses the electronic circuit and the acoustic generator,
wherein the electronic apparatus has a function of generating sound from the acoustic generator.

* * * * *